(12) United States Patent
Kwak

(10) Patent No.: US 10,691,533 B2
(45) Date of Patent: Jun. 23, 2020

(54) ERROR CORRECTION CODE SCRUB SCHEME

(71) Applicant: Micron Technology, Inc., Boise, ID (US)

(72) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 15/839,617

(22) Filed: Dec. 12, 2017

(65) Prior Publication Data

US 2019/0179700 A1 Jun. 13, 2019

(51) Int. Cl.
*G06F 11/00* (2006.01)
*G06F 11/10* (2006.01)
*G11C 11/22* (2006.01)
*G11C 11/406* (2006.01)
*G11C 29/52* (2006.01)
*G11C 11/4076* (2006.01)
*G11C 11/4099* (2006.01)
*G11C 7/10* (2006.01)
*G11C 29/04* (2006.01)

(52) U.S. Cl.
CPC ........ *G06F 11/1068* (2013.01); *G06F 11/106* (2013.01); *G11C 11/221* (2013.01); *G11C 11/406* (2013.01); *G11C 11/4076* (2013.01); *G11C 11/4099* (2013.01); *G11C 29/52* (2013.01); *G11C 7/1006* (2013.01); *G11C 2029/0409* (2013.01); *G11C 2029/0411* (2013.01); *G11C 2211/4062* (2013.01)

(58) Field of Classification Search
CPC ..... G11C 11/221; G11C 11/406; G11C 29/52; G06F 11/1068
See application file for complete search history.

(56) References Cited

U.S. PATENT DOCUMENTS

| | | | | | |
|---|---|---|---|---|---|
| 5,966,389 | A | * | 10/1999 | Kiehl | G06F 11/1008 714/763 |
| 8,161,355 | B2 | * | 4/2012 | Fung | G06F 11/1068 365/185.22 |
| 8,407,560 | B2 | * | 3/2013 | Ordentlich | G06F 11/1028 714/763 |
| 8,429,513 | B2 | * | 4/2013 | Smith | G06F 21/00 714/799 |
| 9,425,829 | B2 | * | 8/2016 | Ramaraju | H03M 13/353 |
| 9,450,609 | B1 | * | 9/2016 | Schmit | H03M 13/05 |
| 9,507,662 | B2 | * | 11/2016 | Andre | G06F 11/1008 |
| 9,575,692 | B2 | * | 2/2017 | Han | G06F 11/1064 |
| 9,685,217 | B2 | * | 6/2017 | Romanovskyy | G11C 11/406 |
| 10,270,471 | B2 | * | 4/2019 | Lu | H03M 13/1575 |
| 10,372,534 | B2 | * | 8/2019 | Berman | G06F 11/1068 |
| 2017/0286216 | A1 | * | 10/2017 | Kozhikkottu | G06F 3/0619 |

* cited by examiner

*Primary Examiner* — Esaw T Abraham
(74) *Attorney, Agent, or Firm* — Holland & Hart LLP

(57) ABSTRACT

Methods, systems, and devices for an error correcting code scrub scheme are described. A memory device may correct an error associated with a first data bit or a first parity bit of a plurality of data bits and a plurality of parity bits, respectively. The memory device may correct the error by reading each of the plurality of data bits and the plurality of parity bits from a memory array, and determining that an error associated with a single bit exists. The memory device may then correct the determined single-bit error, and may write the corrected bit directly back to the memory array.

19 Claims, 9 Drawing Sheets

ERROR CORRECTION CODE SCRUB SCHEME

BACKGROUND

The following relates generally to operating a memory array and more specifically to an error correcting code scrub scheme.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. An error correcting code (ECC) scheme may be configured to correct a single data bit error of a memory array. For example, one or more parity bits and one or more data bits may be written to a memory array as part of an encoding process, and subsequently read from the array as part of a decoding process. Though this process may determine and correct a single bit error associated with the data bits, the memory array must contain sufficient storage to accommodate each of the parity bits and data bits. Additionally or alternatively, the necessary read and write processes may result in additional power consumption and added time for the ECC operation to determine and correct the single bit error, particularly during an ECC scrub operation.

DETAILED DESCRIPTION

Figure 1:
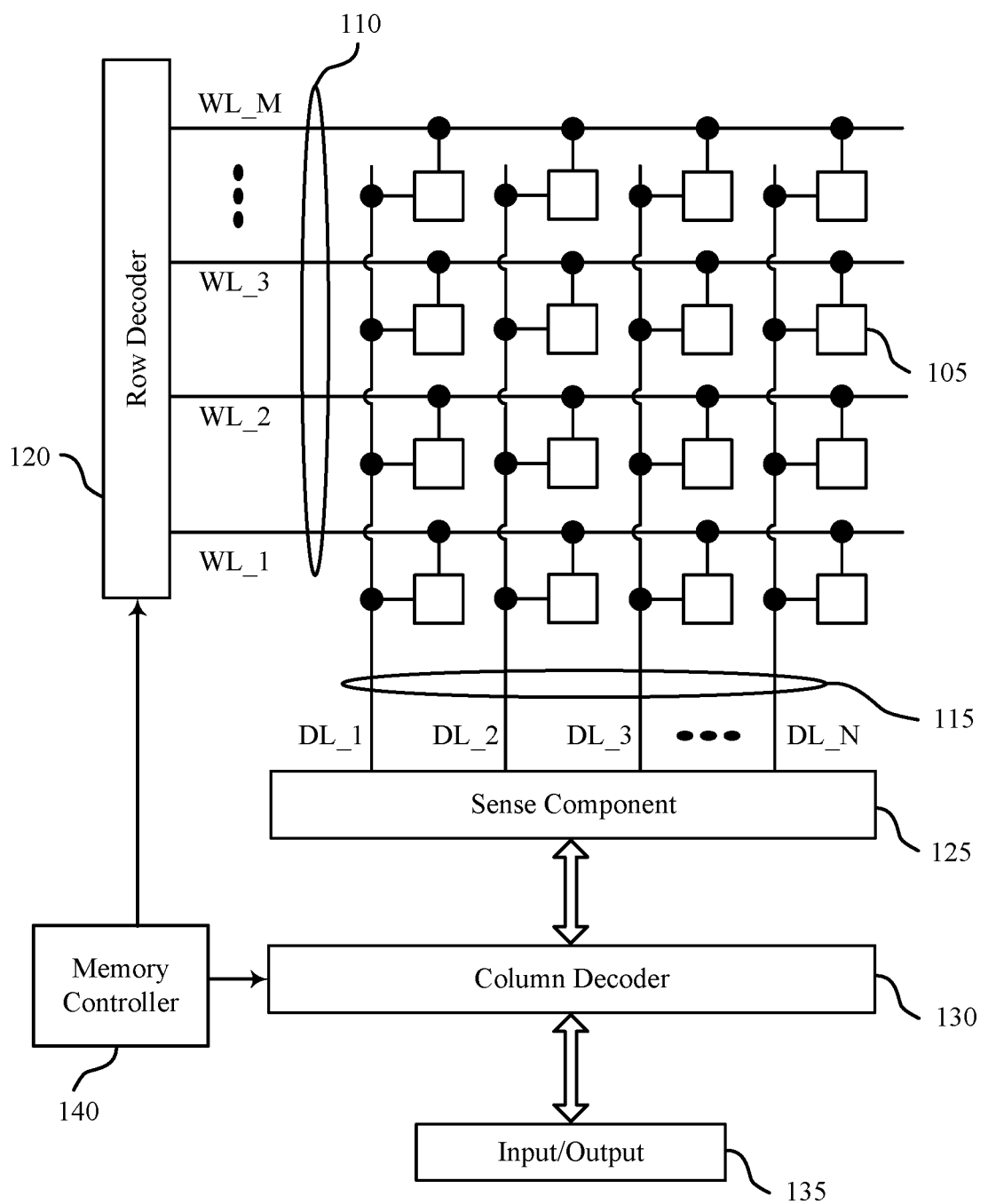
FIG. 1 illustrates an example of a memory array that supports an error correcting code scrub scheme in accordance with examples of the present disclosure.

For various memory processes, one or more data bits and one or more parity bits are often encoded and written to a memory array. Subsequently, the data bits and parity bits may be read from the memory array and, via a decoding process, a single bit error corresponding to the data bits may be determined. The single bit error may then be corrected and may be encoded and re-written to the memory array. Because the data has been corrected, and because the data may be combined with "new" data (e.g., additional user data), it must be encoded before being written to the memory array. This process often requires that the memory array be sized accordingly (e.g., capable of storing additional, encoded, data), and is time and power consuming. Thus, a memory device capable of omitting aspects of the encoding process in some circumstances may reduce the amount of storage space in a memory array consumed by the encoded data, may result in improved timing of an ECC operation and reduced power consumption.

In a first example, an error associated with a first parity bit of a plurality of parity bits may be corrected. For example, a plurality of data bits and a plurality of parity bits may be read from a memory array. The plurality of parity bits and the plurality of data bits may be decoded, which may result in determining an error associated with a first parity bit of the plurality of parity bits. The first parity bit may, for example, be associated with a subset of the plurality of data bits. In some examples, the determination of the error may be based in part on decoding the parity bits and data bits. In some examples, the error associated with the first parity bit may be corrected. In some examples the corrected first parity bit may then be written to the memory array based in part on correcting the error associated with the parity bit. In some examples, the plurality of data bits may be written to the memory array based in part on correcting the error associated with the first parity bit. In some embodiments, the memory array may include a plurality of DRAM cells or, a plurality of FeRAM cells, among other examples.

In another example, an error associated with a first parity bit of a plurality of parity bits may be corrected. For example, a plurality of data bits and a plurality of parity bits may be read from a memory array and may be decoded. Decoding the data bits and parity bits may result in the determination of an error associated with a first parity bit of the plurality of parity bits. In some examples, the error associated with the first parity bit may be corrected, which may be based in part on determining the error. In other examples the corrected first parity bit may then be written to the memory array based in part on correcting the error associated with the parity bit. Additionally or alternatively, for example, a second plurality of data bits and a second plurality of parity bits may be read from the memory array. This may occur, for example, before or after the corrected first parity bit is written to the memory array. In some examples, the second plurality of data bits and second plurality of parity bits may be decoded and, in other examples, a second error associated with a first data bit of the second plurality of data bits may be determined. The second error may be determined, for example, based in part on decoding the second plurality of data bits and parity bits. The second error associated with the first data bit may then be corrected and, in some examples, written to the memory array based in part on correcting the error.

Features of the disclosure introduced above are further described below in the context of a memory array that supports an error correcting code scrub scheme, for example, in FIG. 1. Specific examples are then described with respect to a circuit and memory devices that support an error correcting scrub scheme, for example, in FIGS. 2 through 9. These and other features of the disclosure are further illustrated by and described with reference to apparatus diagrams, system diagrams, and flowcharts that relate to an error correcting code scrub scheme.

FIG. 1 illustrates an example memory array 100 that supports an error correcting code scrub scheme in accordance with various examples of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below. As described herein, memory array 100 may include a plurality of DRAM cells or, in some examples, may include a plurality of FeRAM cells.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 may be connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

Memory array 100 may be a two-dimensional (2D) memory array or a three-dimensional (3D) memory array. A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level.

Each row of memory cells 105 may be connected to a single word line 110, and each column of memory cells 105 may be connected to a single digit line 115. In the example depicted in FIG. 1, memory array 100 includes one/two level/levels of memory cells 105 and may thus be considered a two-dimensional/three-dimensional memory array; however, the number of levels is not limited. By activating one word line 110 and one digit line 115 (e.g., applying a voltage to the word line 110 or digit line 115), a single memory cell 105 may be accessed at their intersection. Additionally, for example, in a 3D memory array, each level in a row may have common conductive lines such that each level may share word lines 110 or digit lines 115 or contain separate word lines 110 or digit lines 115. Thus in a 3D configuration one word line 110 and one digit line 115 of a same level may be activated to access a single memory cell 105 at their intersection. The intersection of a word line 110 and digit line 115, in either a 2D or 3D configuration, may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 may result in an electrical connection or closed circuit between the capacitor of a memory cell 105 and its corresponding digit line 115. The digit line may then be accessed to either read or write the memory cell 105. Other lines (not shown in FIG. 1) may be present. For example, plate lines, described in more detail with reference to at least FIG. 2, may be coupled to the memory cell 105.

Accessing memory cells 105 may be controlled through a row decoder 120, a column decoder 130 and, in some cases, a plate line decoder (not shown). For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, in the case that memory array 100 includes a plurality of FeRAM cells, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

In some examples, a memory cell 105 or a plurality of memory cells 105 may undergo a scrub operation designed to periodically read out a plurality of data bits and a plurality of parity bits from memory array 100. A scrub operation may occur, for example, to prevent multiple-bit errors from accumulating in memory array 100. Specifically, during a scrub operation, a plurality of parity bits and a plurality of data bits may be read from memory array 100. Each of the plurality of data bits and the plurality of parity bits may undergo a decoding operation where, for example, an error associated with a first parity bit of the plurality of parity bits may be determined. The error may be subsequently corrected, for example, based in part on determining the error. By correcting the error during a scrub operation (e.g., as opposed to during a read operation), multiple-bit errors may be prevented from occurring in memory array 100—meaning that single bit errors may be corrected before potentially developing into multiple-bit errors. In some examples, the corrected first parity bit may then be written back to memory array 100 based in part on correcting the error associated with the first parity bit.

As described above, a scrub operation may occur to prevent the accumulation of multiple-bit errors in memory array 100. Despite the outcome of a scrub operation differing from, for example, a read operation (e.g., to determine the stored state of the memory cell 105), the two processes may occur in a similar manner. For example, in the case that memory array 100 includes a plurality of FeRAM cells, after accessing the memory cell 105, the ferroelectric capacitor of memory cell 105 may discharge onto its corresponding digit line 115. The discharging may cause a change in the voltage of the digit line 115, which sense component 125 may compare to a reference voltage (not shown). This process may be the same or similar in either a read or scrub operation. For example, during a read operation the comparison by sense component 125 may determine a stored logic state of memory cell 105. During a scrub operation, for example, the comparison by sense component 125 may determine the stored state of a parity bit associated with the memory cell 105. The state of the parity bit associated with the memory cell 105 may, for example, aid in the determination of the error associated with the first parity bit and, ultimately, the correction of the parity bit.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. In some examples, a plurality of parity bits and a plurality of data bits may be stored to various memory cells 105 of memory array 100. Each of the plurality of data bits and the plurality of parity bits may be written to the memory cells 105 as described above (e.g., via word line 110 and digit line 115). In some examples, as described above, each of the plurality of data bits and the plurality of parity bits may be read from the memory array 100 and an error associated with a first parity bit may be determined and corrected. In some examples, the corrected parity bit may be written directly to memory array 100 (e.g., not encoded). Thus, in such an example, the corrected parity bit may be written to the memory array 100 as described above (e.g., by activating word line 110 and digit line 115).

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Further, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some examples, the memory controller 140 may facilitate the correction of one or more parity bits associated with memory array 100. For example, memory controller 140 may be coupled with memory array 100 and may initiate a reading of a plurality of data bits and a plurality of parity bits from the memory array 100. In some examples, the memory controller 140 may then initiate decoding of the plurality of data bits and the plurality of parity bits and, for example, may initiate the correction of the error associated with the first parity bit. In other examples, the memory controller 140 may then initiate writing the corrected first parity bit to memory array 100.

Figure 2:
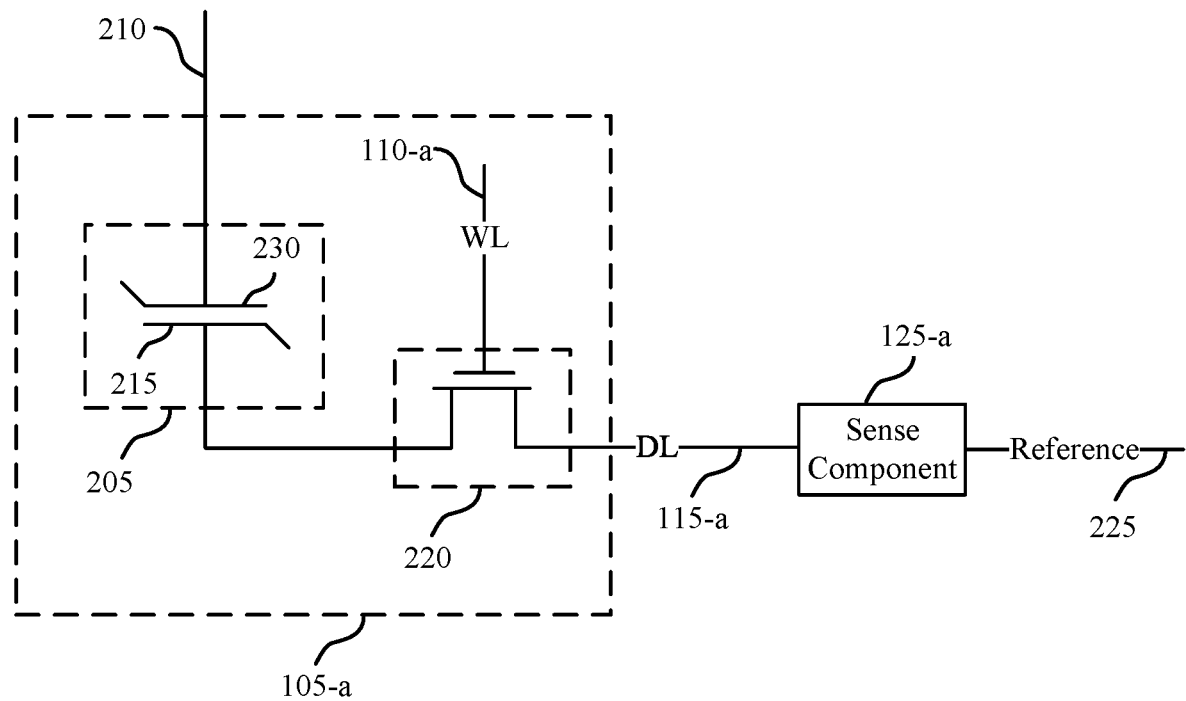
FIG. 2 illustrates an example circuit related to a memory cell that supports an error correcting code scrub scheme in accordance with examples of the present disclosure.

FIG. 2 illustrates an example circuit 200 that supports an error correcting code scrub scheme in accordance with various examples of the present disclosure. Circuit 200 includes a memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-*a*. Thus circuit 200 may be implemented in a memory device that contains a plurality of FeRAM cells, as described above with reference to FIG. 1. Circuit 200 may also include selection component 220 and reference line 225. Cell plate 230 may be accessed via plate line 210 and cell bottom 215 may be accessed via digit line 115-*a*. As described above, various states may be stored by charging or discharging capacitor 205.

The stored state of capacitor 205 may be read or sensed by operating various elements represented in circuit 200.

Capacitor 205 may be in electronic communication with digit line 115-*a*. For example, capacitor 205 can be isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the threshold magnitude of the transistor. Word line 110-*a* may activate the selection component 220; for example, a voltage applied to word line 110-*a* is applied to the transistor gate, connecting capacitor 205 with digit line 115-*a*.

As described above with reference to FIG. 1, a memory cell 105-*a* or a plurality of memory cells 105-*a* may undergo a scrub operation. During the scrub operation, for example, a plurality of parity bits and a plurality of data bits may be read from a memory array (e.g., memory array 100 as described with reference to FIG. 1). Each of the plurality of data bits and the plurality of parity bits may undergo a decoding operation, and an error associated with a first parity bit of the plurality of parity bits may be determined. The error may be subsequently corrected and written back to the memory array. This process, as described above, may eliminate the need for or aspects of an encoding process before writing the corrected parity bit to the memory array. Thus the scrub operation may occur in a similar manner as a read operation.

For example, in the case that the memory array includes a plurality of FeRAM cells, after accessing the memory cell 105-*a*, the ferroelectric capacitor of memory cell 105-*a* may discharge onto its corresponding digit line 115-*a*. The discharging may cause a change in the voltage of the digit line 115-*a*, which sense component 125-*a* may compare to a voltage of reference line 225 in order to determine the stored state of a parity bit associated with the memory cell 105-*a*. The state of the parity bit associated with the memory cell 105-*a* may, for example, aid in the determination of the error associated with the first parity bit and, ultimately, the correction of the parity bit.

In other examples, the positions of selection component 220 and capacitor 205 may be switched, such that selection component 220 is connected between plate line 210 and cell plate 230 and such that capacitor 205 is between digit line 115-*a* and the other terminal of selection component 220. In this example, selection component 220 may remain in electronic communication with digit line 115-*a* through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-*a*. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground, which may be referred to as "floating," before biasing plate line 210 and word line 110-*a*. Biasing plate line 210 may result in a voltage difference (e.g., plate line 210 voltage minus digit line 115-*a* voltage) across capacitor 205. The voltage difference may yield a change in the stored charge on capacitor 205, where the magnitude of the change in stored charge may depend on the initial state of capacitor 205— e.g., whether the initial state stored a logic 1 or a logic 0. This may cause a change in the voltage of digit line 115-*a* based on the charge stored on capacitor 205. Operation of memory cell 105-*a* by varying the voltage to cell plate 230 may be referred to as "moving cell plate."

The change in voltage of digit line 115-*a* may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

In some examples, a plurality of parity bits and a plurality of data bits may be stored to various memory cells of a memory array (e.g., memory array 100 as described with reference to FIG. 1). Each of the plurality of data bits and the plurality of parity bits may be written to the memory cells as described above (e.g., via digit line 115-*a*). In some examples, as described above, each of the plurality of data bits and the plurality of parity bits may be read from the memory array and an error associated with a first parity bit may be determined and corrected. In some examples, the corrected parity bit may be written to the memory array without being encoded between the time of correction and the time of writing. Thus, in such an example, the corrected parity bit may be written to the memory array, (e.g., via digit line 115-a).

Figure 3:
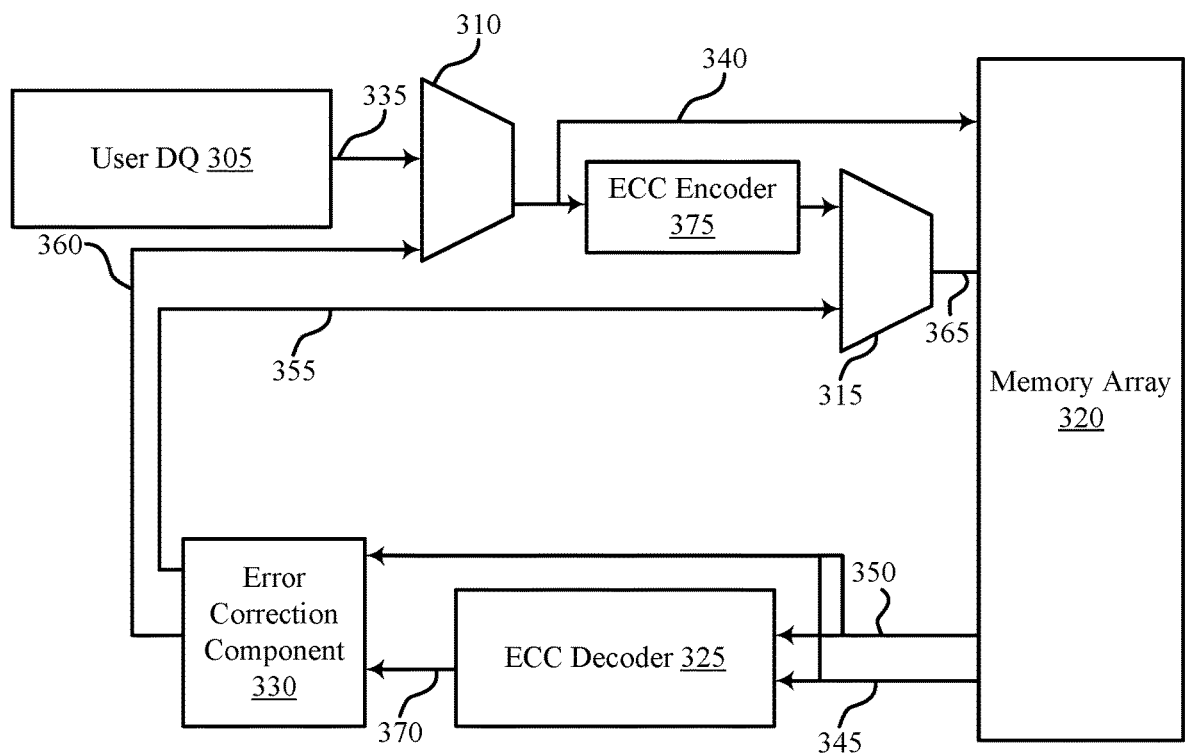
FIGS. 3 and 4 illustrate examples of a memory device that supports an error correcting code scrub scheme in accordance with examples of the present disclosure.

FIG. 3 illustrates an example of a memory device 300 that supports an error correcting code scrub scheme in accordance with various examples of the present disclosure. The memory device 300 may include user data input 305; memory array 320, which may be an example of memory array 100 as described with reference to FIG. 1; ECC decoder 325; error correction component 330; and ECC encoder 375, among other components. The memory device 300 may also include multiplexer 310 and multiplexer 315, as well as signaling paths 335, 340, 345, 350, 355, 360, 365, and 370.

In some examples, a plurality of data bits and a plurality of parity bits may be read from memory array 320. As described above, the plurality of data bits and the plurality of parity bits may be read from memory array 320. Thus the data bits may have been previously written to memory array 320 and the parity bits may have been previously determined and written to memory array 320. Each of the plurality of data bits and the plurality of data bits may be read from memory array 320 via signaling paths 350 and 345, respectively. In some examples, a memory controller (e.g., memory controller 140 as described with reference to FIG. 1) may initiate the reading of each of the plurality of data bits and the plurality of parity bits from the memory array 320. In some examples, each parity bit may be associated with a subset of data bits. For example, 8 parity bits may be read from the memory array for every 128 data bits. Upon being read from memory array 320, the plurality of data bits and plurality of parity bits may be received by ECC decoder 325.

The ECC decoder 325 may, in some examples, be or may include a binary decoder and may be referred to as binary ECC decoder 325. In some examples, the ECC decoder 325 may decode the plurality of data bits and the plurality of parity bits. The decoding process related to ECC decoder 325 may facilitate the determination of an error associated with a first parity bit of the plurality of parity bits. To decode the plurality of data bits and the plurality of parity bits, for example, ECC decoder 325 may receive each of the plurality of data bits and the plurality of parity bits from memory array 320. The ECC decoder 325 may receive the plurality of parity bits via signaling path 345 and may receive the plurality of data bits via signaling path 350. The decoder may then, in some examples, transmit the decoded data to error correction component 330. In some examples, the decoded data bits and parity bits may be transmitted to error correction component 330 via signaling path 370.

In some examples, error correction component 330 may determine at least one error associated with a first parity bit of the plurality of parity bits. In some examples, the error correction component 330 may then correct the error associated with the first parity bit. The error may be corrected, in some examples, based in part on determining the error at ECC decoder 325 or in response to the decoding process that occurred at ECC decoder 325. As previously discussed, error correction component 330 may receive the decoded data bits and parity bits via signaling path 370. In some examples, error correction component 330 may also receive the plurality of parity bits, or an indication of the plurality of parity bits, read from memory array 320 via signaling path 345. Thus, in some examples, error correction component 330 may correct the error associated with the first parity bit after receiving each of the plurality of parity bits and the decoded data bits and parity bits.

Upon correcting the error associated with the first parity bit, for example, at error correction component 330, the corrected parity bit may be written to the memory array 320. In some examples, the corrected parity bit may be written to the memory array 320 based in part on correcting the error. In other examples, the corrected parity bit may be written to the memory array 320, directly, via signaling path 355. In other examples, the corrected parity bit may be multiplexed with additional data—for example, from data via data input 305—before writing the corrected parity bit to the memory array 320. The multiplexing may occur, for example, at multiplexer 315 and the multiplexed parity bit and data may be written to the memory array 320 via signaling path 365. In some examples, the additional data received via data input 305 may be encoded, for example, via ECC encoder 375. In some examples, the memory device 300 may determine at least one bit error associated with at least one of the plurality of data bits or at least one of the plurality of parity bits. Thus correcting the error associated with the first parity bit may be based at least in part on determining the at least one bit error.

In some examples, the memory device 300 may be configured to determine and correct one or more data bits. For example, as discussed above, a plurality of data bits and a plurality of parity bits may be read from memory array 320. The plurality of data bits and the plurality of parity bits may be received by ECC decoder 325 via signaling paths 350 and 345, respectively. ECC decoder 325 may decode the plurality of data bits and the plurality of parity bits, and transmit the decoded bits to error correction component 330. The error correction component 330, based on receiving the decoded bits, may determine an error in one or more parity bits and/or one or more data bits. Thus, in some examples, an error may exist in a parity bit (e.g., a first parity bit) and in a data bit (e.g., a first data bit). This may be referred to as a two-bit error. As described above, the error correction component 330 may correct the error associated with the first parity bit. Subsequently, for example, the error correction component 330 may correct the error associated with the first data bit. Thus memory device 300 may determine two bit errors each associated with one of the plurality of data bits or the plurality of parity bits, and subsequently correct the error associated with the first parity bit and the first data bit.

As discussed above, after correcting the first parity bit and writing the first parity bit to the memory array 320, the memory device 300 may correct a first data bit associated with memory array 320. In some examples, a second plurality of data bits and a second plurality of parity bits may be read from the memory array. In some examples, each of the second plurality of data bits and the second plurality of parity bits may be the same as, or may be different from, the plurality of parity bits and the plurality of data bits read from memory array 320 and utilized in the process to correct the error associated with the first parity bit. Each of the second plurality of data bits and the second plurality of parity bits may be read from memory array 320 and transmitted to ECC decoder 325 via signaling paths 350 and 345, respectively.

Upon receiving the second plurality of data bits and the second plurality of parity bits at ECC decoder 325, the decoder may decode each of the second plurality of data bits and the second plurality of parity bits. In some examples the ECC decoder 325 may decode the second plurality of data bits and the second plurality of parity bits. The decoding process may aid in the determination of an error associated with a first data bit of the plurality of data bits. Thus, ECC decoder 325 may receive each of the plurality of data bits and the plurality of parity bits and transmit the decoded data to error correction component 330. In some examples, the decoded data may be transmitted to error correction component 330 via signaling path 370.

In some examples, error correction component 330 may determine one or more errors associated with a first data bit of the plurality of data bits and correct the error associated with the first data bit. The error may be corrected based in part on determining the error at ECC decoder 325 or in response to the decoding process that occurred at ECC decoder 325. In some examples, error correction component 330 may receive the plurality of data bits, or an indication of the plurality of data bits, read from memory array 320 via signaling path 350. Thus, in some examples, error correction component 330 may correct the error associated with the first data bit after receiving each of the plurality of data bits, or the indication of the plurality of data bits.

In some examples, the corrected data bit may be transmitted, via signaling path 360, to multiplexer 310. The corrected data may, for example, be multiplexed with additional data received via data input 305. In some examples, the multiplexed corrected data and the data received via data input 305 may be transmitted to ECC encoder 375 prior to being written to memory array 320 via signaling path 340. For example, the multiplexed corrected data and the data received via input 305 may be encoded, via ECC encoder 375, to determine a parity bit. This parity bit may be used in determining an error associated with the data in a subsequent read operation (e.g., reading data from memory array 320). The parity bit may then be written to memory array 320.

In another example, the error correction component 330 may transmit a corrected parity bit to multiplexer 315 and a plurality of data bits to multiplexer 310. As discussed above, multiplexer 310 may be configured to perform a data mask operation. Thus multiplexer 310 may perform a data mask operation on the plurality of data bits, before the data bits are encoded via ECC encoder 375. Upon conducting a data mask operation (e.g., multiplexing the plurality of parity bits with data received via input 305), the multiplexed data may be transmitted to ECC encoder 375. At ECC encoder 375, an additional parity bit may be determined that is based on the multiplexed parity bits and the additional data received via input 305. This parity bit may be referred to as a second parity bit and, as discussed above, may be used in determining an error associated with data from a subsequent read operation. Upon determining the parity bit, the error correction component 330 may initiate multiplexing of the corrected first parity bit with the parity bit determined via ECC encoder 375. The multiplexing may occur at, for example, multiplexer 315. The error correction component 3330 may then, in some examples, initiate writing the multiplexed corrected first parity bit and the parity bit determined via ECC encoder 375 to the memory array 320.

In other examples, the corrected data and the data received via data input 305 may be multiplexed—via multiplexer 310—as part of a write with data mask operation. Conversely, for example, during a scrub operation, multiplexer 310 may select the corrected data received via signaling path 360. In some examples, the write with data mask may include a write address (e.g., of a memory cell). For example, the write with data mask may correspond to data having been previously written to and read from (e.g., during a scrub operation) the memory array 320. The masked data may then be multiplexed with the data received via data input 305 (e.g., data having not been previously written to memory array 320), encoded via ECC encoder 375 and, subsequently, written to the memory array 320. In any of the aforementioned examples, the memory array 320 may include a plurality of memory cells. In some examples, memory array 320 may include a plurality of DRAM cells and, in other examples, memory array 320 may include a plurality of FeRAM cells. In either instance, the memory array 320 may support correcting an error associated with a parity bit and/or a data bit associated with the array, and subsequently writing the corrected data bit and/or parity bit back to the memory array 320.

Figure 4:
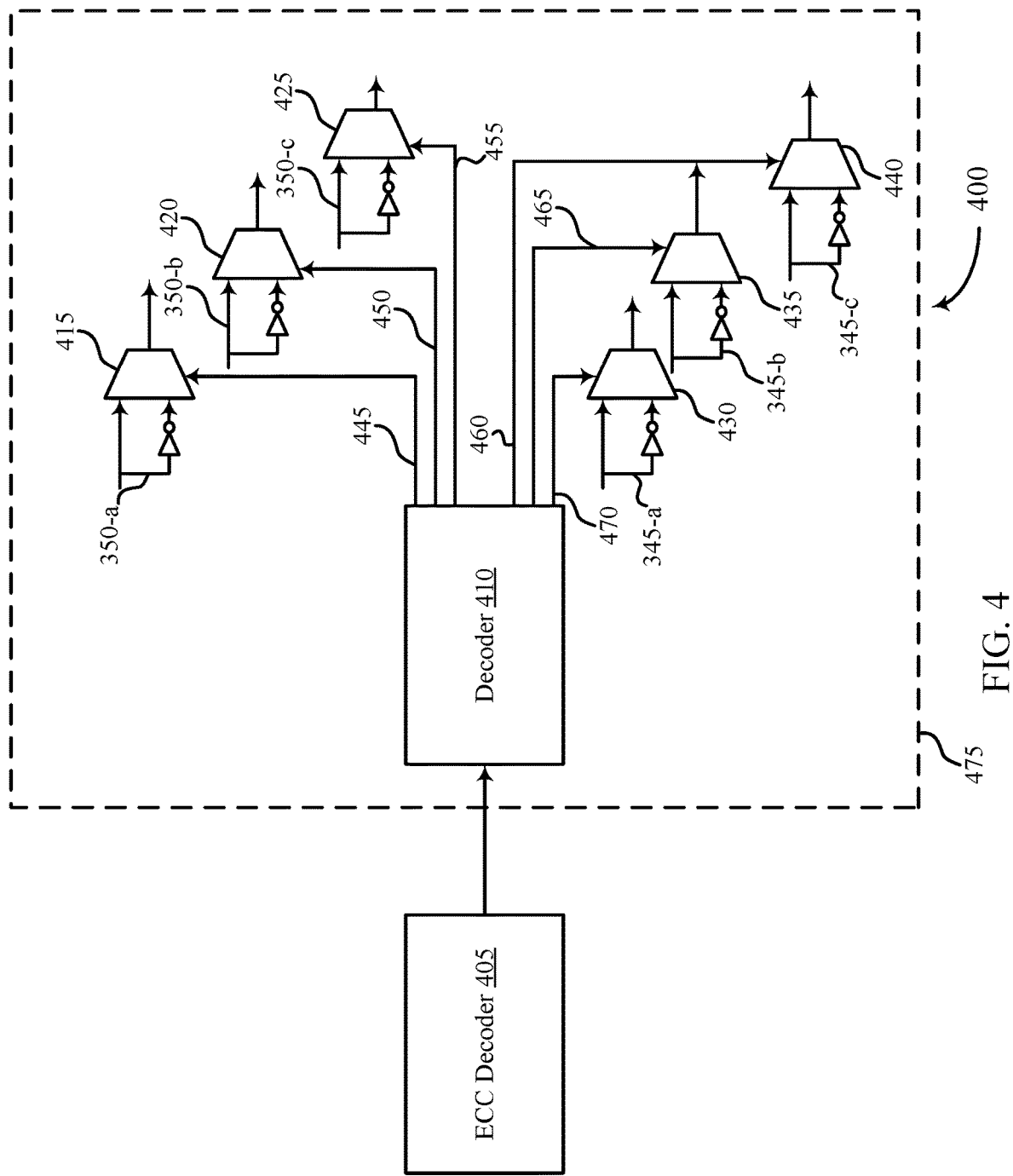

FIG. 4 illustrates an example of a memory device 400 that supports an error correcting code scrub scheme in accordance with various examples of the present disclosure. The memory device 400 may include ECC decoder 405, which may be an example of ECC decoder 325 as described with reference to FIG. 3; and error correction component 475, which may be an example of error correction component 330 as described with reference to FIG. 3, among other components. In some examples, error correction component 475 may include decoder 410 multiplexers 415, 420, 425, 430, 435, and 440, and signaling paths 445, 450, 455, 460, 465, and 470. Additionally or alternatively, for example, memory device 400 may include signaling paths 345-*a*, 345-*b*, 345-*c*, 350-*a*, 350-*b*, and 350-*c*, which may be examples of signaling paths 345 and 350, respectively, as discussed with respect to FIG. 3.

As described above, error correction component 475 may be an example of error correction component 330 as described with reference to FIG. 3 and thus may be an example of one configuration for correcting an error associated with a first parity bit or a first data bit of a plurality of parity bits and a plurality of data bits, respectively. In some examples, the first plurality of data bits and the first plurality of parity bits may be read from a memory array (e.g., memory array 320 as described with reference to FIG. 3), and ECC decoder 405 may decode each of the plurality of bits. In other examples, the decoded first plurality of data bits and the first plurality of parity bits may be received at decoder 410 of error correction component 475.

In some examples, the decoder 410 may determine, or may aid in the determination of, an error associated with a first parity bit of the plurality of parity bits. In other examples, in a subsequent scrub operation, the decoder 410 may determine, or may aid in the determination of, an error associated with a first data bit of the plurality of data bits. In either example, the decoder 410 may transmit the error, an indication of the error, or a location of the error (e.g., an error location signal), to a respective multiplexer or multiplexers of error correction component 475 to correct the respective first parity bit or first data bit.

In the instance that error correction component 475 may correct an error associated with a parity bit, decoder 410 may determine, or may aid in the determination of, the error associated with a first parity bit. Upon determining the error, the decoder 410 may transmit the error, or an indication of the error to, for example, multiplexer 430 via signaling path 470. Multiplexer 430 may also receive, via signaling path 345-*a*, at least one of the parity bits read from the memory array. Each of multiplexers 430, 435, and 440 may be configured to correct an error associated with a respective parity bit.

In other examples, error correction component 475 may include a plurality of multiplexers configured to correct an error associated with a respective parity bit. For example, as described above, 8 parity bits may be read from a memory array (e.g., memory array 320 as described with reference to FIG. 3) for every 128 data bits. Thus, in such an example, error correction component 475 may include 8 multiplexers—one for each parity bit read from the array. In the example discussed above, the decoder 410 may determine an error with the first (e.g., the first of eight) parity bit. Thus, the first multiplexer may be configured to correct the error associated with the first parity bit. For example, the multiplexer 430 may receive the error, or the indication of the error, as well as at least one of the plurality of parity bits via signaling path 345-a. The multiplexer 430 may then correct the error associated with the first parity bit and, in some examples, may transmit the corrected parity bit so that it may be written to the memory array.

In another example, error correction component 475 may correct an error associated with a data bit after correcting an error associated with a parity bit. For example, error correction component 475 may correct an error associated with a data bit in a subsequent scrub operation. In some examples, decoder 410 may determine, or may aid in the determination of, the error associated with a first data bit. Upon determining the error, the decoder 410 may transmit the error, an indication of the error, or a location of the error (e.g., an error location signal) to multiplexer 415 via signaling path 445. Multiplexer 415 may be configured to receive, via signaling path 350-a, at least one of the plurality of data bits read from the memory array. Each of multiplexers 415, 420, and 425 may be configured to correct an error associated with a respective data bit.

In other examples, error correction component 475 may include a plurality of multiplexers configured to correct an error associated with a respective data bit. For example, as described above, 8 parity bits may be read from a memory array (e.g., memory array 320 as described with reference to FIG. 3) for every 128 data bits. Thus, in such an example, error correction component 475 may include 128 multiplexers—one for each data bit read from the array. In the example discussed above, the decoder 410 may determine an error with the first (e.g., the first of one hundred twenty-eight) data bit after correcting an error associated with a first parity bit. Thus, the first multiplexer may be configured to correct the error associated with the first data bit. To correct the error, multiplexer 415 may receive the error, or the indication of the error, via signaling path 445. The multiplexer 415 may also receive, via signaling path 350-a, at least one of the plurality of data bits read from the memory array. The multiplexer 415 may the correct the error associated with the first data bit and, in some examples, may transmit the corrected data bit so that it may be written to the memory array.

Figure 5:
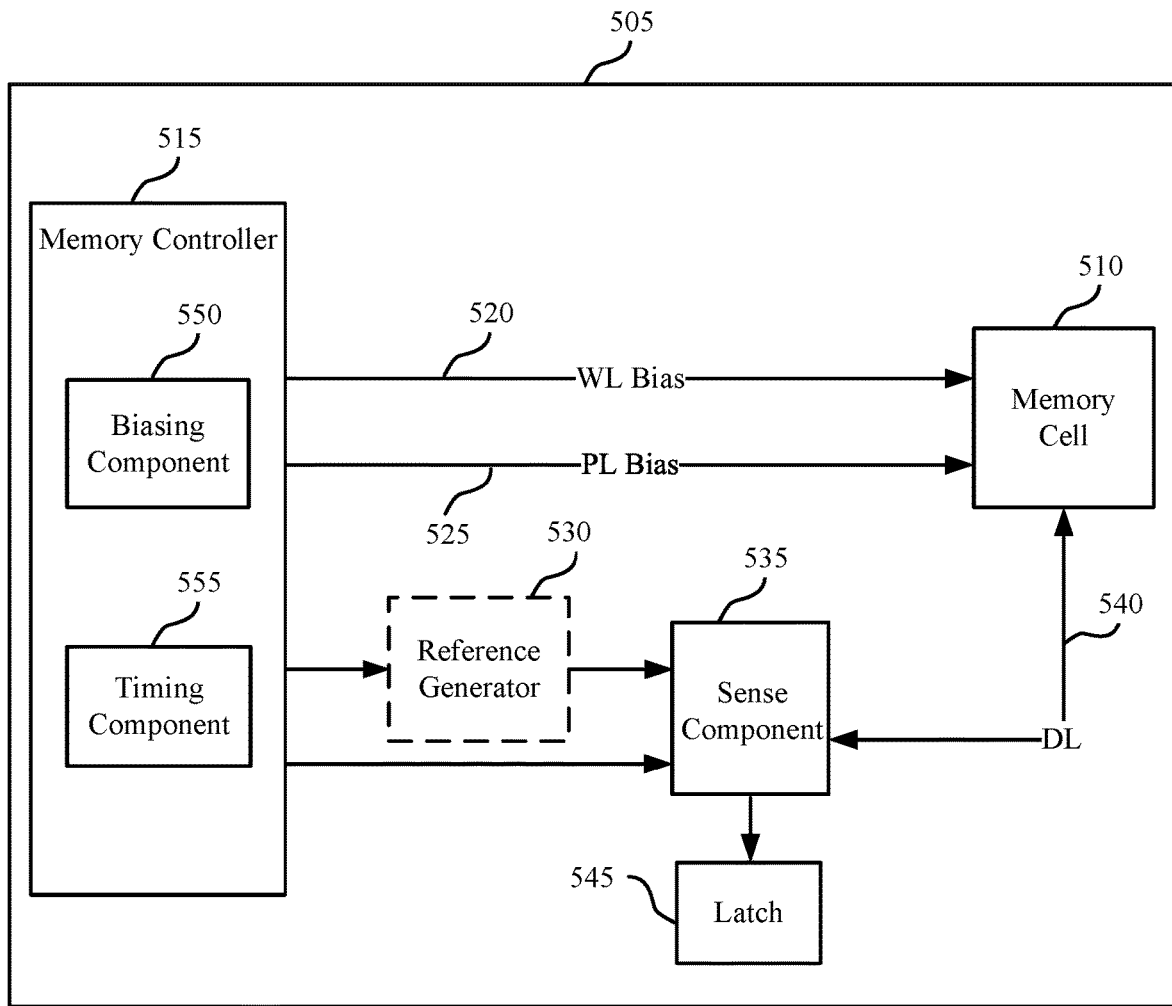
FIGS. 5 and 6 show block diagrams of devices that support an error correcting code scrub scheme in accordance with examples of the present disclosure.

FIG. 5 shows a block diagram 500 of a memory array 505 that supports an error correcting code scrub scheme in accordance with examples of the present disclosure. Memory array 505 may be referred to as an electronic memory apparatus, and may be an example of a component of a memory device as described herein.

Memory array 505 may include one or more memory cells 510, a memory controller 515, a word line 520, a plate line 525, a reference generator 530, a sense component 535, a digit line 540, and a latch 545. These components may be in electronic communication with each other and may perform one or more of the functions described herein. In some cases, memory controller 515 may include biasing component 550 and timing component 555. In some cases, sense component 535 may serve as the reference generator 530. In other cases, reference generator 530 may be optional.

Memory controller 515 may be in electronic communication with word line 520, digit line 540, sense component 535, and plate line 525, which may be examples of word line 110, digit line 115, sense component 125, and plate line 210 described with reference to FIGS. 1, and 2. Memory array 505 may also include reference generator 530 and latch 545. The components of memory array 505 may be in electronic communication with each other and may perform aspects of the functions described with reference to FIGS. 1 through 5. In some cases, reference generator 530, sense component 535, and latch 545 may be components of memory controller 515.

In some examples, digit line 540 is in electronic communication with sense component 535 and a ferroelectric capacitor of ferroelectric memory cells 510. A ferroelectric memory cell 510 may be writable with a logic state (e.g., a first or second logic state). Word line 520 may be in electronic communication with memory controller 515 and a selection component of ferroelectric memory cell 510. Plate line 525 may be in electronic communication with memory controller 515 and a plate of the ferroelectric capacitor of ferroelectric memory cell 510. Sense component 535 may be in electronic communication with memory controller 515, digit line 540, latch 545, and reference line 560. reference generator 530 may be in electronic communication with memory controller 515 and reference line 560. Sense control line 565 may be in electronic communication with sense component 535 and memory controller 515. These components may also be in electronic communication with other components, both inside and outside of memory array 505, in addition to components not listed above, via other components, connections, or buses.

Memory controller 515 may be configured to activate word line 520, plate line 525, or digit line 540 by applying voltages to those various nodes. For example, biasing component 550 may be configured to apply a voltage to operate memory cell 510 to read or write memory cell 510 as described above. In some cases, memory controller 515 may include a row decoder, column decoder, or both, as described herein. This may enable memory controller 515 to access one or more memory cells 105. Biasing component 550 may also provide voltage to reference generator 530 in order to generate a reference signal for sense component 535. Additionally, biasing component 550 may provide voltage for the operation of sense component 535.

In some cases, memory controller 515 may perform its operations using timing component 555. For example, timing component 555 may control the timing of the various word line selections or plate biasing, including timing for switching and voltage application to perform the memory functions, such as reading and writing, discussed herein. In some cases, timing component 555 may control the operations of biasing component 550.

In some examples, reference generator 530 may include various components to generate a reference signal for sense component 535. Reference generator 530 may include circuitry configured to produce a reference signal. In some cases, reference generator 530 may be implemented using other ferroelectric memory cells 105. Sense component 535 may compare a signal from memory cell 510 (through digit line 540) with a reference signal from reference generator 530. Upon determining the logic state, the sense component may then store the output in latch 545, where it may be used in accordance with the operations of an electronic device that memory array 505 is a part. Sense component 535 may include a sense amplifier in electronic communication with the latch and the ferroelectric memory cell.

In other examples, memory controller 515 may be an example of aspects of the memory controller 715 described with reference to FIG. 7. Memory controller 515 and/or at least some of its various sub-components may be implemented in hardware, software executed by a processor, firmware, or any combination thereof. If implemented in software executed by a processor, the functions of the memory controller 515 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 515 and/or at least some of its various sub-components may be physically located at various positions, including being distributed such that portions of functions are implemented at different physical locations by one or more physical devices. In some examples, memory controller 515 and/or at least some of its various sub-components may be a separate and distinct component in accordance with various examples of the present disclosure. In other examples, memory controller 515 and/or at least some of its various sub-components may be combined with one or more other hardware components, including but not limited to an I/O component, a transceiver, a network server, another computing device, one or more other components described in the present disclosure, or a combination thereof in accordance with various examples of the present disclosure.

Memory controller 515 may read a plurality of data bits and a plurality of parity bits from a memory array, decode the plurality of data bits and the plurality of parity bits, determine an error associated with a first parity bit of the plurality of parity bits based on decoding the plurality of data bits and the plurality of parity bits, correct the error associated with the first parity bit based on determining the error, and write the corrected first parity bit to the memory array based on correcting the error associated with the first parity bit.

The memory controller 515 may also initiate decoding of the plurality of data bits and the plurality of parity bits, initiate determining an error associated with a first parity bit of the plurality of parity bits, initiate correcting the error associated with the first parity bit, and initiate writing the corrected first parity bit to the memory array. In some cases, a memory array may include a plurality of memory cells. In some cases, a decoder may be coupled with the memory array. In other cases, an error correction component may be coupled with the decoder. In some cases, a controller may be coupled with the memory array, the controller operable to initiate reading a plurality of data bits and a plurality of parity bits from the memory array.

In other examples, memory controller 515 may be operable to initiate reading a plurality of data bits and a plurality of parity bits from the memory array, and may support means for initiating decoding of the plurality of data bits and the plurality of parity bits, means for initiating determining an error associated with a first parity bit of the plurality of parity bits, means for initiating correcting the error associated with the first parity bit, and means for initiating writing the corrected first parity bit to the memory array.

Figure 6:
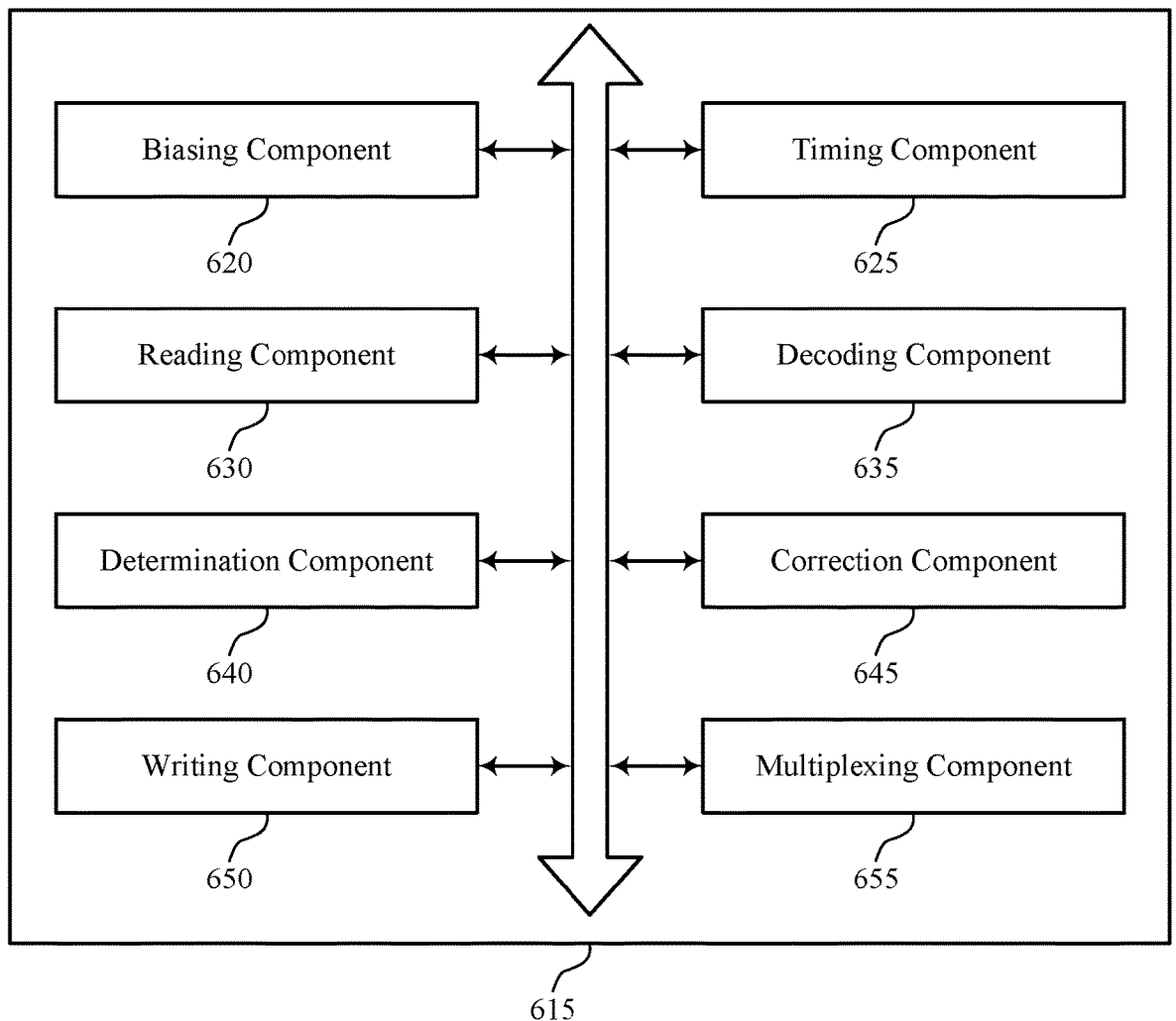

FIG. 6 shows a block diagram 600 of a memory controller 615 that supports an error correcting code scrub scheme in accordance with examples of the present disclosure. The memory controller 615 may be an example of aspects of a memory controller 715 described with reference to FIGS. 5 and 7. The memory controller 615 may include biasing component 620, timing component 625, reading component 630, decoding component 635, determination component 640, correction component 645, writing component 650, and multiplexing component 655. Each of these modules may communicate, directly or indirectly, with one another (e.g., via one or more buses).

In some examples, reading component 630 may read a plurality of data bits and a plurality of parity bits from a memory array and read a second plurality of data bits and a second plurality of parity bits from the memory array.

In other examples, decoding component 635 may decode the plurality of data bits and the plurality of parity bits, and decode the second plurality of data bits and the second plurality of parity bits.

Determination component 640 may determine an error associated with a first parity bit of the plurality of parity bits based on decoding the plurality of data bits and the plurality of parity bits. In other examples, determination component 740 may determine a second error associated with a first data bit of the second plurality of data bits based on decoding the second plurality of data bits and the second plurality of parity bits. In some cases, the error associated with the first parity bit may be corrected before the error associated with the first data bit of the second plurality of data bits is corrected. In other cases, the first parity bit of the plurality of parity bits may be associated with a subset of the plurality of data bits. In some cases, the memory array may include a set of dynamic random-access memory (random access memory (RAM)) cells. In other cases, the plurality of data bits and the plurality of parity bits may be decoded in response to a refresh operation of at least one of the set of DRAM cells. Additionally or alternatively, for example, the memory array may include a set of ferroelectric memory cells (FeRAM).

Correction component 645 may correct the error associated with the first parity bit based on determining the error and correct the error associated with the first data bit of the second plurality of data bits based on determining the error.

Writing component 650 may write the corrected first parity bit to the memory array based on correcting the error associated with the first parity bit, write the set of data bits to the memory array based on correcting the error associated with the first parity bit, and write the corrected first data bit to the memory array based on correcting the error associated with the first data bit.

In some examples, multiplexing component 665 may multiplex the corrected first data bit with an additional plurality of data bits before writing the corrected first data bit to the memory array.

Figure 7:
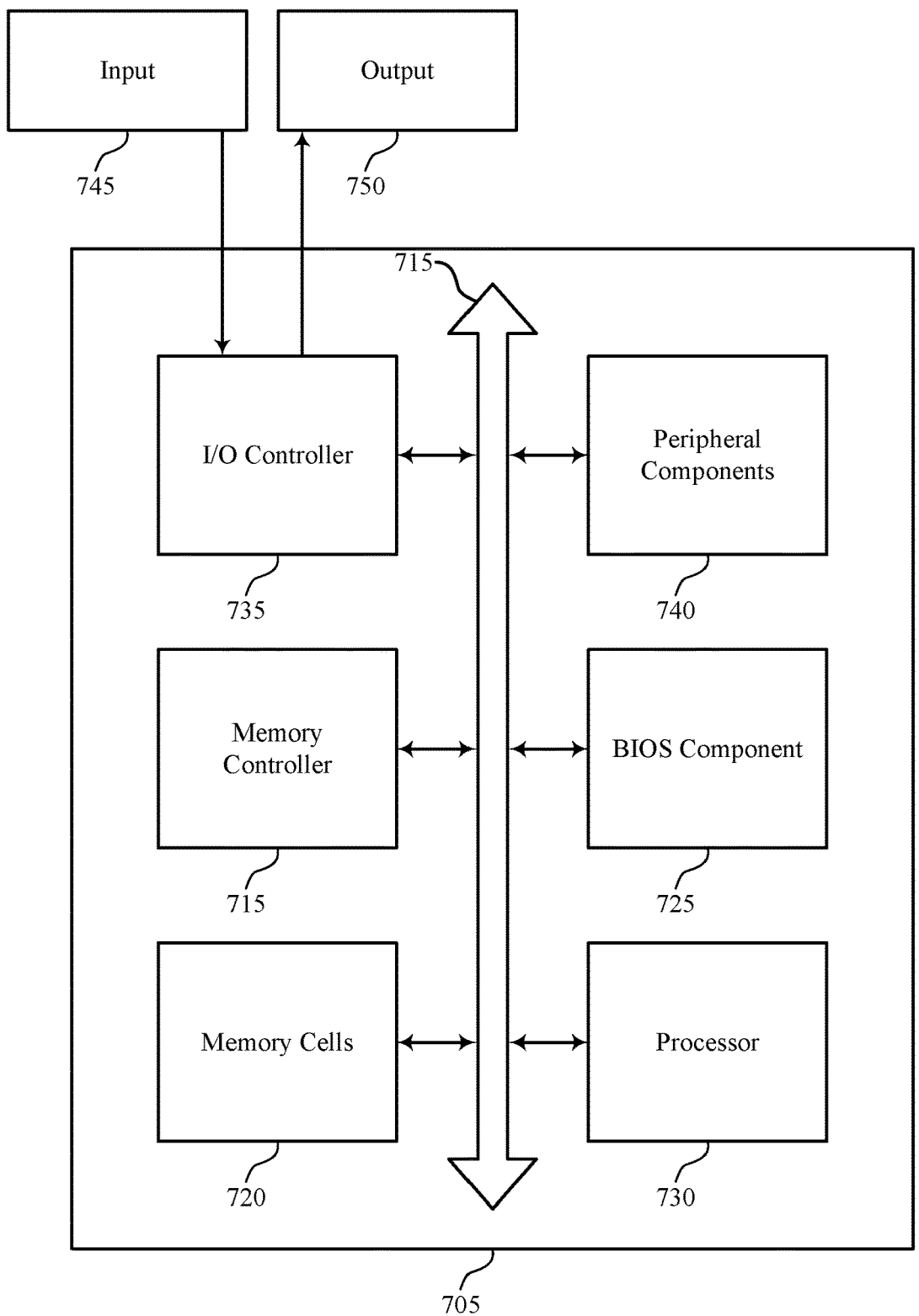
FIG. 7 illustrates a block diagram of a system including a memory device that supports an error correcting code scrub scheme in accordance with examples of the present disclosure.

FIG. 7 shows a diagram of a system 700 including a device 705 that supports an error correcting code scrub scheme in accordance with examples of the present disclosure. Device 705 may be an example of or include the components of memory device 400 as described above, e.g., with reference to FIG. 4. Device 705 may include components for bi-directional voice and data communications including components for transmitting and receiving communications, including memory controller 715, memory cells 720, basic input/output system (BIOS) component 725, processor 730, I/O controller 735, and peripheral components 740. These components may be in electronic communication via one or more buses (e.g., bus 710).

Memory controller 715 may operate one or more memory cells as described herein. Specifically, memory controller 715 may be configured to support an error correcting code scrub scheme. In some cases, memory controller 715 may include a row decoder, column decoder, or both, as described herein (not shown).

Memory cells 720 may store information (i.e., in the form of a logical state) as described herein.

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 730 may be configured to operate a memory array using a memory controller. In other cases, a memory controller may be integrated into processor 730. Processor 730 may be configured to execute computer-readable instructions stored in a memory to perform various functions (e.g., functions or tasks supporting an error correcting code scrub scheme).

I/O controller 735 may manage input and output signals for device 705. I/O controller 735 may also manage peripherals not integrated into device 705. In some cases, I/O controller 735 may represent a physical connection or port to an external peripheral. In some cases, I/O controller 735 may utilize an operating system such as iOS®, ANDROID®, MS-DOS®, MS-WINDOWS®, OS/2®, UNIX®, LINUX®, or another known operating system. In other cases, I/O controller 735 may represent or interact with a modem, a keyboard, a mouse, a touchscreen, or a similar device. In some cases, I/O controller 735 may be implemented as part of a processor. In some cases, a user may interact with device 705 via I/O controller 735 or via hardware components controlled by I/O controller 735.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 745 may represent a device or signal external to device 705 that provides input to device 705 or its components. This may include a user interface or an interface with or between other devices. In some cases, input 745 may be managed by I/O controller 735, and may interact with device 705 via a peripheral component 740.

Output 750 may also represent a device or signal external to device 705 configured to receive output from device 705 or any of its components. Examples of output 750 may include a display, audio speakers, a printing device, another processor or printed circuit board, etc. In some cases, output 750 may be a peripheral element that interfaces with device 705 via peripheral component(s) 740. In some cases, output 750 may be managed by I/O controller 735

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or aspect of such a device.

Figure 8:
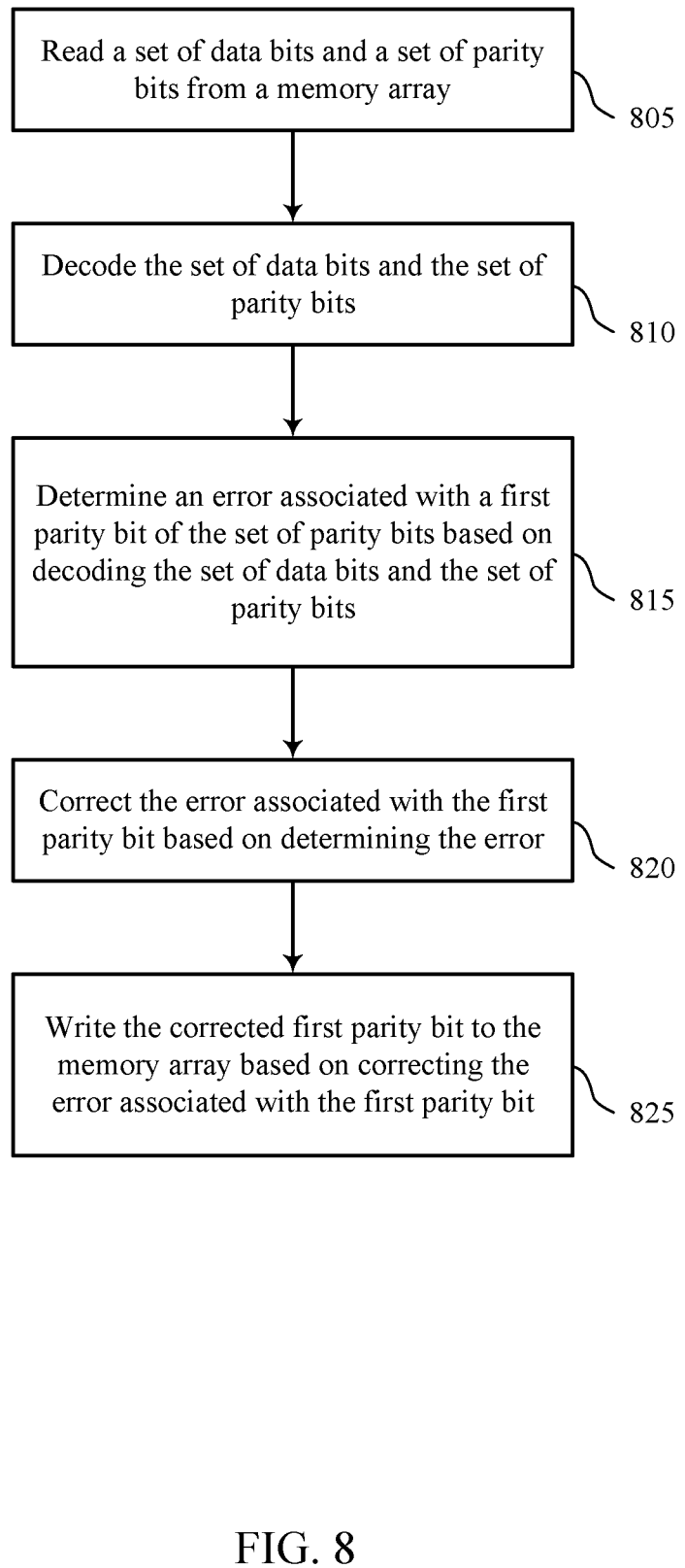
FIGS. 8 and 9 illustrate methods for error correcting code scrub scheme in accordance with examples of the present disclosure.

FIG. 8 shows a flowchart illustrating a method 800 for an error correcting code scrub scheme in accordance with examples of the present disclosure. The operations of method 800 may be implemented by a memory device or its components as described herein. For example, the operations of method 800 may be performed by a memory controller as described with reference to FIGS. 5 through 7. In some examples, a memory device may execute a set of codes to control the functional elements of the device to perform the functions described below. Additionally or alternatively, the memory device may perform aspects of the functions described below using special-purpose hardware.

At 805 the memory device may read a plurality of data bits and a plurality of parity bits from a memory array. The operations of 805 may be performed according to the methods described herein. In certain examples, aspects of the operations of 805 may be performed by a reading component as described with reference to FIGS. 5 through 7.

At 810 the memory device may decode the plurality of data bits and the plurality of parity bits. The operations of 810 may be performed according to the methods described herein. In certain examples, aspects of the operations of 810 may be performed by a decoding component as described with reference to FIGS. 5 through 7.

At 815 the memory device may determine an error associated with a first parity bit of the plurality of parity bits based at least in part on decoding the plurality of data bits and the plurality of parity bits. The operations of 815 may be performed according to the methods described herein. In certain examples, aspects of the operations of 815 may be performed by a determination component as described with reference to FIGS. 5 through 7.

At 820 the memory device may correct the error associated with the first parity bit based at least in part on determining the error. The operations of 820 may be performed according to the methods described herein. In certain examples, aspects of the operations of 820 may be performed by a correction component as described with reference to FIGS. 5 through 7.

At 825 the memory device may write the corrected first parity bit to the memory array based at least in part on correcting the error associated with the first parity bit. The operations of 825 may be performed according to the methods described herein. In certain examples, aspects of the operations of 825 may be performed by a writing component as described with reference to FIGS. 5 through 7.

In some cases, the method may also include reading a plurality of data bits and a plurality of parity bits from a memory array. In some examples, the memory array may include a plurality of ferroelectric memory cells (FeRAM). In other cases, the method may include determining an error associated with a first parity bit of the plurality of parity bits based at least in part on decoding the plurality of data bits and the plurality of parity bits.

Additionally or alternatively, for example, the method may include correcting the error associated with the first parity bit based at least in part on determining the error. In some examples, the method may include writing the corrected first parity bit to the memory array based at least in part on correcting the error associated with the first parity bit. In other cases, the method may include writing the plurality of data bits to the memory array based at least in part on correcting the error associated with the first parity bit.

In some cases, the method may include reading a second plurality of data bits and a second plurality of parity bits from the memory array. Additionally or alternatively, for example, the method may include decoding the second plurality of data bits and the second plurality of parity bits. In some examples, the method may include decoding the plurality of data bits and the plurality of parity bits. In other cases, the method may include correcting the error associated with the first data bit of the second plurality of data bits based at least in part on determining the error. In other examples, the method may include writing the corrected first data bit to the memory array based at least in part on correcting the error associated with the first data bit.

In some examples, the error associated with the first parity bit may be corrected before the error associated with the first data bit of the second plurality of data bits is corrected. In other cases, the method may include multiplexing the corrected first data bit with an additional plurality of data bits before writing the corrected first data bit to the memory array. Additionally or alternatively, for example, the first parity bit of the plurality of parity bits may be associated with a subset of the plurality of data bits. In other cases, the memory array may include a plurality of dynamic random-access memory (DRAM) cells.

In other examples, the plurality of data bits and the plurality of parity bits may be decoded in response to a refresh operation of at least one of the plurality of DRAM cells. In some cases, the method may include determining a second error associated with a first data bit of the second plurality of data bits based at least in part on decoding the second plurality of data bits and the second plurality of parity bits.

Figure 9:
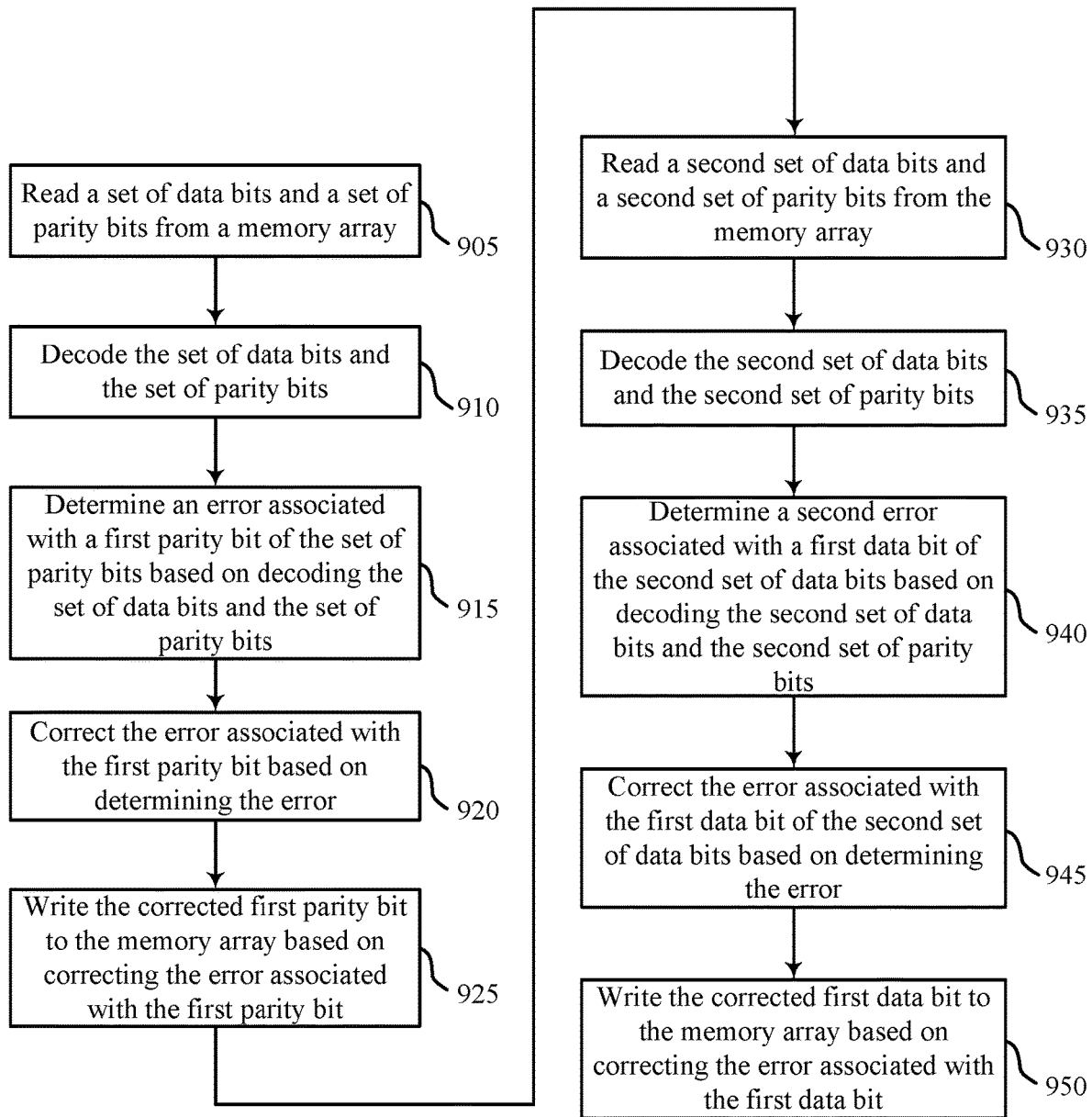

FIG. 9 shows a flowchart illustrating a method 900 for an error correcting code scrub scheme in accordance with examples of the present disclosure. The operations of method 900 may be implemented by a memory device or its components as described herein. For example, the operations of method 900 may be performed by a memory controller as described with reference to FIGS. 1 through 5. In some examples, a memory device may execute a set of codes to control the functional elements of the device to perform the functions described below. Additionally or alternatively, the memory device may perform aspects of the functions described below using special-purpose hardware.

At 905 the memory device may read a plurality of data bits and a plurality of parity bits from a memory array. The operations of 905 may be performed according to the methods described herein. In certain examples, aspects of the operations of 905 may be performed by a reading component as described with reference to FIGS. 1 through 5.

At 910 the memory device may decode the plurality of data bits and the plurality of parity bits. The operations of 910 may be performed according to the methods described herein. In certain examples, aspects of the operations of 910 may be performed by a decoding component as described with reference to FIGS. 1 through 5.

At 915 the memory device may determine an error associated with a first parity bit of the plurality of parity bits based at least in part on decoding the plurality of data bits and the plurality of parity bits. The operations of 915 may be performed according to the methods described herein. In certain examples, aspects of the operations of 915 may be performed by a determination component as described with reference to FIGS. 1 through 5.

At 920 the memory device may correct the error associated with the first parity bit based at least in part on determining the error. The operations of 920 may be performed according to the methods described herein. In certain examples, aspects of the operations of 920 may be performed by a correction component as described with reference to FIGS. 1 through 5.

At 925 the memory device may write the corrected first parity bit to the memory array based at least in part on correcting the error associated with the first parity bit. The operations of 925 may be performed according to the methods described herein. In certain examples, aspects of the operations of 925 may be performed by a writing component as described with reference to FIGS. 1 through 5.

At 930 the memory device may read a second plurality of data bits and a second plurality of parity bits from the memory array. The operations of 930 may be performed according to the methods described herein. In certain examples, aspects of the operations of 930 may be performed by a reading component as described with reference to FIGS. 1 through 5.

At 935 the memory device may decode the second plurality of data bits and the second plurality of parity bits. The operations of 935 may be performed according to the methods described herein. In certain examples, aspects of the operations of 935 may be performed by a decoding component as described with reference to FIGS. 1 through 5.

At 940 the memory device may determine a second error associated with a first data bit of the second plurality of data bits based at least in part on decoding the second plurality of data bits and the second plurality of parity bits. The operations of 940 may be performed according to the methods described herein. In certain examples, aspects of the operations of 940 may be performed by a determination component as described with reference to FIGS. 1 through 5.

At 945 the memory device may correct the error associated with the first data bit of the second plurality of data bits based at least in part on determining the error. The operations of 945 may be performed according to the methods described herein. In certain examples, aspects of the operations of 945 may be performed by a correction component as described with reference to FIGS. 1 through 5.

At 950 the memory device may write the corrected first data bit to the memory array based at least in part on correcting the error associated with the first data bit. The operations of 950 may be performed according to the methods described herein. In certain examples, aspects of the operations of 950 may be performed by a writing component as described with reference to FIGS. 1 through 5.

In some examples, the method may include reading a plurality of data bits and a plurality of parity bits from a memory array. In other cases, the method may include decoding the plurality of data bits and the plurality of parity bits. Additionally or alternatively, for example, the method may include determining an error associated with a first parity bit of the plurality of parity bits based at least in part on decoding the plurality of data bits and the plurality of parity bits.

In other examples, the method may include correcting the error associated with the first parity bit based at least in part on determining the error. In some cases, the method may include writing the plurality of data bits to the memory array based at least in part on correcting the error associated with the first parity bit. Additionally or alternatively, for example, the method may include writing the corrected first parity bit to the memory array based at least in part on correcting the error associated with the first parity bit.

It should be noted that the methods described above describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    reading a plurality of data bits and a plurality of parity bits from a memory array;
    decoding the plurality of data bits and the plurality of parity bits;
    determining an error associated with a first parity bit of the plurality of parity bits based at least in part on decoding the plurality of data bits and the plurality of parity bits, wherein the error is determined based at least in part on identifying an incorrect bit value of the first parity bit;
    correcting the error associated with the first parity bit based at least in part on determining the error; and
    writing the corrected first parity bit to the memory array based at least in part on correcting the error associated with the first parity bit.

2. The method of claim 1, further comprising:
    writing the plurality of data bits to the memory array based at least in part on correcting the error associated with the first parity bit.

3. The method of claim 1, further comprising:
    reading a second plurality of data bits and a second plurality of parity bits from the memory array;
    decoding the second plurality of data bits and the second plurality of parity bits;
    determining a second error associated with a first data bit of the second plurality of data bits based at least in part on decoding the second plurality of data bits and the second plurality of parity bits;
    correcting the error associated with the first data bit of the second plurality of data bits based at least in part on determining the error; and
    writing the corrected first data bit to the memory array based at least in part on correcting the error associated with the first data bit.

4. The method of claim 3, wherein the error associated with the first parity bit is corrected before the error associated with the first data bit of the second plurality of data bits is corrected.

5. The method of claim 3, further comprising:
    multiplexing the corrected first data bit with an additional plurality of data bits before writing the corrected first data bit to the memory array.

6. The method of claim 1, wherein the first parity bit of the plurality of parity bits is associated with a subset of the plurality of data bits.

7. The method of claim 1, wherein the memory array comprises a plurality of dynamic random-access memory (DRAM) cells.

8. The method of claim 7, wherein the plurality of data bits and the plurality of parity bits are decoded in response to a refresh operation of at least one of the plurality of DRAM cells.

9. The method of claim 1, wherein the memory array comprises a plurality of ferroelectric memory cells (Fe-RAM).

10. A memory device, comprising:
    a memory array comprising a plurality of memory cells;
    a decoder coupled with the memory array, the decoder configured to decode a plurality of data bits and a plurality of parity bits read from the memory array; and
    an error correction component coupled with the decoder, the error correction component configured to:
    determine at least one error associated with a first parity bit of the plurality of parity bits, or a first data bit of the plurality of data bits, or both, wherein the at least one error is determined based at least in part on identifying an incorrect bit value of the first parity bit, the first data bit, or both; and
    correct an error associated with the first parity bit of the plurality of parity bits based at least in part on determining the at least one error.

11. The memory device of claim 10, wherein the error correction component is further configured to:
    initiate writing the corrected first parity bit to the memory array.

12. The memory device of claim 11, further comprising:
    multiplexing the corrected first data bit with an additional plurality of data bits before writing the corrected first data bit to the memory array.

13. The memory device of claim 12, wherein the corrected first data bit is multiplexed with the additional plurality of data bits during a data mask operation.

14. The memory device of claim 10, wherein the error correction component is further configured to:
    correct the error associated with the first data bit of the plurality of data bits; and initiate writing the corrected first data bit to the memory array.

15. The memory device of claim 10, wherein the memory array comprises a plurality of dynamic random-access memory (DRAM) cells, and wherein the plurality of data bits and the plurality of parity bits are decoded in response to a refresh operation of at least one of the plurality of DRAM cells.

16. The memory device of claim 10, wherein the memory array comprises a plurality of ferroelectric memory cells (FeRAM).

17. An apparatus, comprising:
a memory array comprising a plurality of memory cells;
a decoder coupled with the memory array;
an error correction component coupled with the decoder; and
a controller coupled with the memory array, the controller operable to:
initiate reading a plurality of data bits and a plurality of parity bits from the memory array;
initiate decoding of the plurality of data bits and the plurality of parity bits;
initiate determining an error associated with a first parity bit of the plurality of parity bits, wherein the error is determined based at least in part on identifying an incorrect bit value of the first parity bit;
initiate correcting the error associated with the first parity bit; and
initiate writing the corrected first parity bit to the memory array.

18. The apparatus of claim 17, wherein the controller is operable to initiate decoding the plurality of data bits and the plurality of parity bits in response to a refresh operation.

19. The apparatus of claim 17, wherein the controller is operable to initiate correcting the error associated with the first parity bit in response to determining the error associated with the first parity bit of the plurality of parity bits.

* * * * *